US009589872B2

(12) United States Patent
Cho et al.

(10) Patent No.: US 9,589,872 B2
(45) Date of Patent: Mar. 7, 2017

(54) INTEGRATED DUAL POWER CONVERTER PACKAGE HAVING INTERNAL DRIVER IC

(71) Applicant: Infineon Technologies Americas Corp., El Segundo, CA (US)

(72) Inventors: Eung San Cho, Torrance, CA (US); Dan Clavette, Greene, RI (US)

(73) Assignee: Infineon Technologies Americas Corp., El Segundo, CA (US)

( * ) Notice: Subject to any disclaimer, the term of this patent is extended or adjusted under 35 U.S.C. 154(b) by 447 days.

(21) Appl. No.: 13/759,734

(22) Filed: Feb. 5, 2013

(65) Prior Publication Data
US 2013/0256807 A1 Oct. 3, 2013

Related U.S. Application Data

(60) Provisional application No. 61/616,949, filed on Mar. 28, 2012.

(51) Int. Cl.
*H01L 23/495* (2006.01)
*H01L 25/16* (2006.01)

(52) U.S. Cl.
CPC .. *H01L 23/49562* (2013.01); *H01L 23/49524* (2013.01); *H01L 23/49575* (2013.01); *H01L 25/16* (2013.01); *H01L 2224/48247* (2013.01); *H01L 2224/49113* (2013.01); *H01L 2224/49171* (2013.01); *H01L 2924/13091* (2013.01); *H01L 2924/30107* (2013.01)

(58) Field of Classification Search
CPC ............ H01L 2224/00; H01L 2924/00; H01L 21/4832; H01L 23/49562; H01L 23/49575; H01L 24/00; H02M 3/00

USPC .......................................................... 257/723
See application file for complete search history.

(56) References Cited

U.S. PATENT DOCUMENTS

| 2008/0251912 A1* | 10/2008 | Otremba | H01L 21/4832 257/723 |
| 2012/0200281 A1* | 8/2012 | Herbsommer | H01L 23/49562 323/311 |
| 2012/0228696 A1* | 9/2012 | Carpenter | H01L 23/49575 257/329 |
| 2012/0248521 A1* | 10/2012 | Herbsommer | H02M 3/00 257/299 |
| 2014/0306332 A1* | 10/2014 | Denison | H01L 24/40 257/676 |

* cited by examiner

*Primary Examiner* — Jerome Jackson, Jr.
*Assistant Examiner* — Fang-Xing Jiang
(74) *Attorney, Agent, or Firm* — Shumaker & Sieffert, P.A.

(57) ABSTRACT

An integrated dual power converter package is disclosed. The package includes a leadframe having a first control FET paddle configured to support a drain of a first control FET, and a second control FET paddle configured to support a drain of a second control FET. The leadframe further includes a sync FET paddle configured to support a source of a first sync FET and a source of a second sync FET, and a driver integrated circuit (IC) paddle configured to support a driver IC for controlling each of the control FETs and each of the sync FETs. The leadframe may additionally include first and second switched nodes, configured for electrical connection to the first control FET and the first sync FET via a first clip, and to the second control FET and the second sync FET via a second clip, respectively.

15 Claims, 4 Drawing Sheets

INTEGRATED DUAL POWER CONVERTER PACKAGE HAVING INTERNAL DRIVER IC

The present application claims the benefit of and priority to a provisional patent application entitled "Dual Phase Power Converter Package and Integration," Ser. No. 61/616,949 filed on Mar. 28, 2012. The disclosure in that provisional application is hereby incorporated fully by reference into the present application.

BACKGROUND

As electronic devices decrease in size, internal electrical circuit packages are, likewise, required to decrease in size as well as offer increased current density and current capacity. In addition, many electronic devices require multiple internal power supply voltages. However, conventional power supply designs, such as conventional buck converters, typically include a half-bridge circuit controlled by a dedicated control IC. Thus, multiple internal power supplies typically require multiple half-bridge circuits, each controlled by a respective control IC. However, conventional power supply packages including a single half-bridge circuit and a dedicated control IC require a physical layout considerably larger than either the half-bridge circuit or dedicated control IC alone. Consequently, utilizing multiple conventional power supply packages can be very space-inefficient, while also having undesirably low current and power densities as well as requiring a larger physical layout within the electronic device.

SUMMARY

The present disclosure is directed to an integrated dual power converter package having internal driver IC, substantially as shown in and/or described in connection with at least one of the figures, as set forth more completely in the claims.

DETAILED DESCRIPTION

Figure 1:
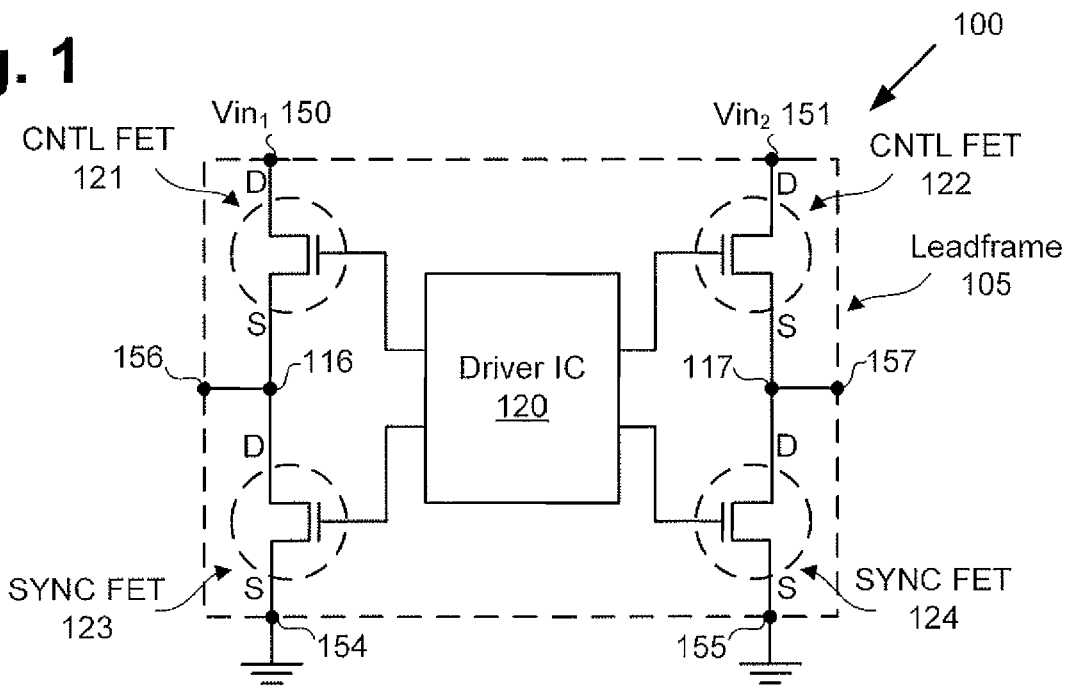
FIG. 1 presents an exemplary diagram of a first half-bridge circuit and a second half-bridge circuit of a dual power converter package, in accordance with one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 presents an exemplary diagram of a first half-bridge circuit and a second half-bridge circuit of a dual power converter package, in accordance with one implementation of the present application. Dual power converter package 100 includes leadframe 105. The first half-bridge circuit may include Control (CNTL) FET 121 having its drain terminal electrically connected to input power supply $Vin_1$ 150 and its source terminal electrically connected to a drain terminal of Synchronous (SYNC) FET 123 to provide switched node 116. The source of SYNC FET 123 may be connected to ground through ground contact 154 of leadframe 105. A first output voltage may be provided from switched node 116 at output voltage contact 156 on leadframe 105.

Likewise, the second half-bridge circuit may include CNTL FET 122 having its drain terminal electrically connected to input power supply $Vin_2$ 151 and its source terminal electrically connected to a drain terminal of SYNC FET 124 to provide switched node 117. The source of SYNC FET 123 may be connected to ground through ground contact 155 of leadframe 105. A second output voltage may be provided on leadframe 105 from switched node 117 at output voltage contact 157. In addition, Driver IC 120 may be located on leadframe 105 any may be configured to control the operation of the CNTL FETs and SYNC FETs in the first and second half-bridge circuits to, among other things, produce the desired output voltage at switched nodes 116 and 117. The half-bridge circuits will become part of a buck converter to convert input voltages $Vin_1$ and $Vin_2$ to output voltages at output voltage contacts 156 and 157, respectively, under control of Driver IC 120.

CNTL FETs and the SYNC FETs may be power MOSFETs (metal oxide semiconductor FETs), or power HEMTs (high electron mobility transistors). A Group III-V HEMT, such as a Group III-N HEMT or more specifically a GaN HEMT can be used for the CNTL FETs and the SYNC FETs. Alternatively, a Group III-V FET, such as a Group III-N FET or more specifically a GaN PET can be used for CNTL FET and SYNC PET.

Figure 2:
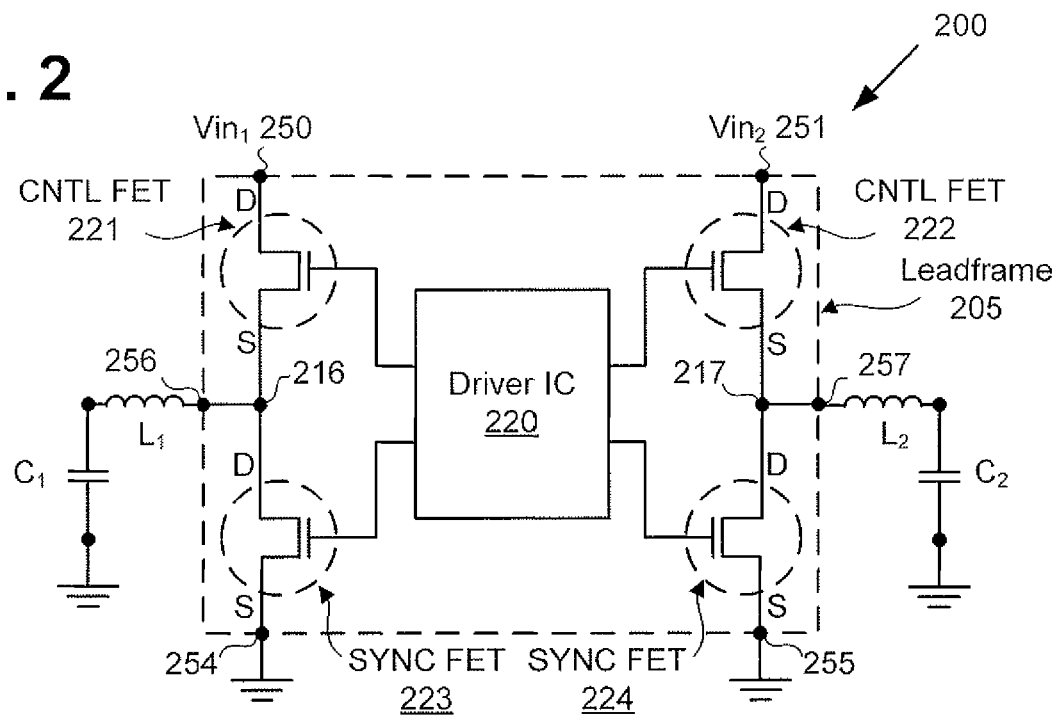
FIG. 2 presents an exemplary diagram of a first half-bridge circuit and a second half-bridge circuit of a dual power converter package, in accordance with another implementation of the present application.

FIG. 2 presents an exemplary diagram of a first half-bridge circuit and a second half-bridge circuit of a dual power converter package, in accordance with another implementation of the present application. Dual power converter package 200 is substantially the same as package 100 of FIG. 1, except further including an inductive/capacitive load connected to the voltage output voltage contacts of the leadframe. Dual power converter package 200 includes leadframe 205. The first half-bridge circuit includes CTRL FET 221 having its drain terminal electrically connected to input power supply $Vin_1$ 250 and its source terminal electrically connected to a drain terminal of SYNC FET 223 providing switched node 216. The source of SYNC FET 223 may be connected to ground through ground contact 254 of leadframe 205. A first output voltage may be provided from switched node 216 at output voltage contact 256 on leadframe 205. Inductance L1 and capacitance C1 may be electrically connected in series between output voltage contact 256 and ground in order to provide smoothing of the switched output at output voltage contact 256.

Likewise, the second half-bridge circuit may include CNTL FET 222 having its drain terminal electrically connected to input power supply Vin$_2$ 251 and its source terminal electrically connected to a drain terminal of SYNC FET 224 to provide switched node 217. The source of SYNC FET 223 may be connected to ground through ground contact 255 of leadframe 205. A second output voltage may be provided from switched node 217 at output voltage contact 257 on leadframe 205. In addition, Driver IC 220 may be located on leadframe 205 and may be configured to control the operation of the CNTL FETs and SYNC FETs in the first and second half-bridge circuits to, among other things, produce the desired output voltage at switched nodes 216 and 217. Inductance L2 and capacitance C2 may be electrically connected in series between output voltage contact 257 and ground in order to provide smoothing of the switched output at output voltage contact 257. The half-bridge circuits will become part of a buck converter to convert input voltages Vin$_1$ and Vin$_2$ to output voltages at output voltage contacts 256 and 257, respectively, under control of Driver IC 220.

Figure 3A:
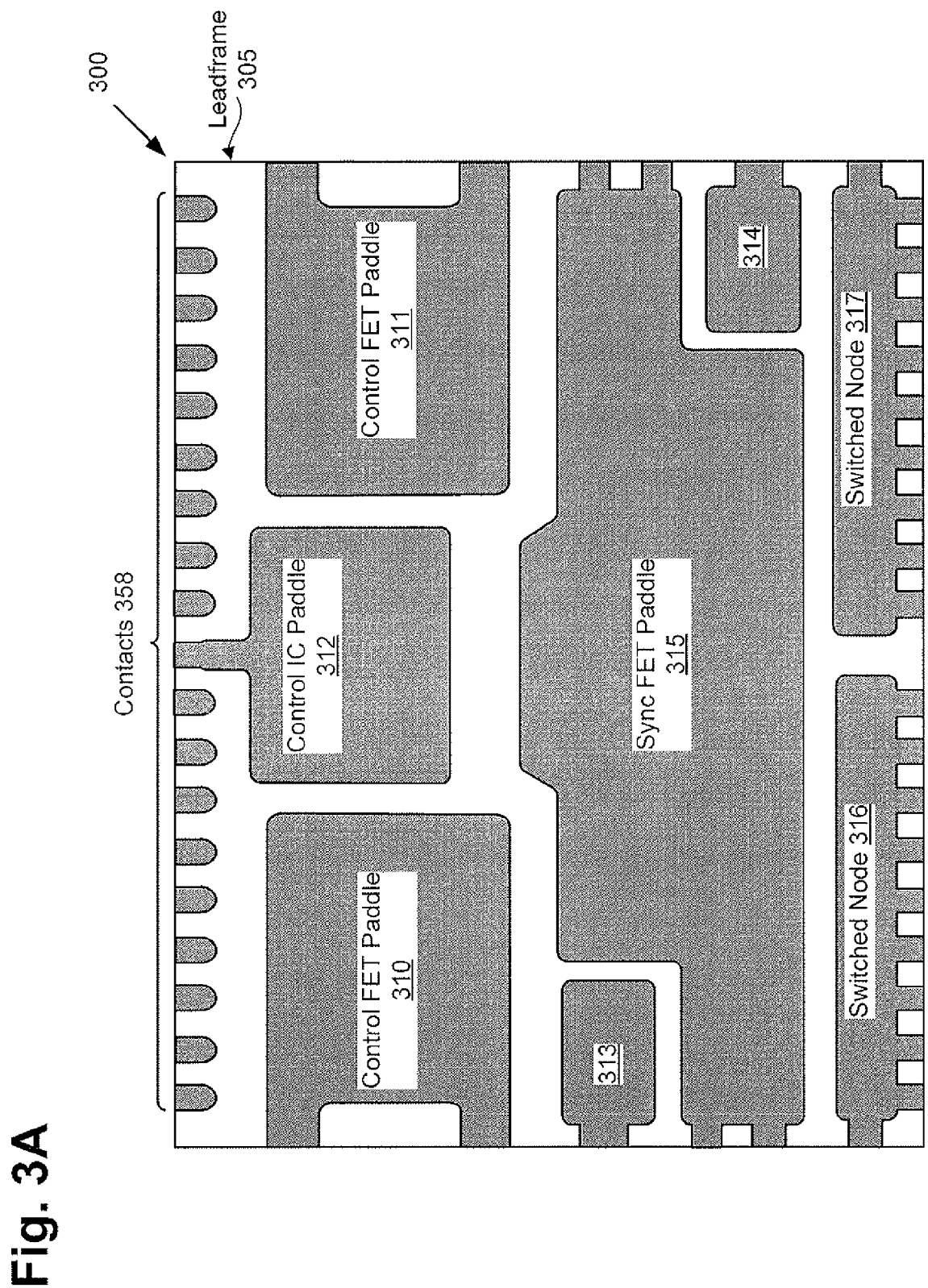
FIG. 3A presents an exemplary top view of a dual power converter package, in accordance with one implementation of the present application.
Figure 3B:
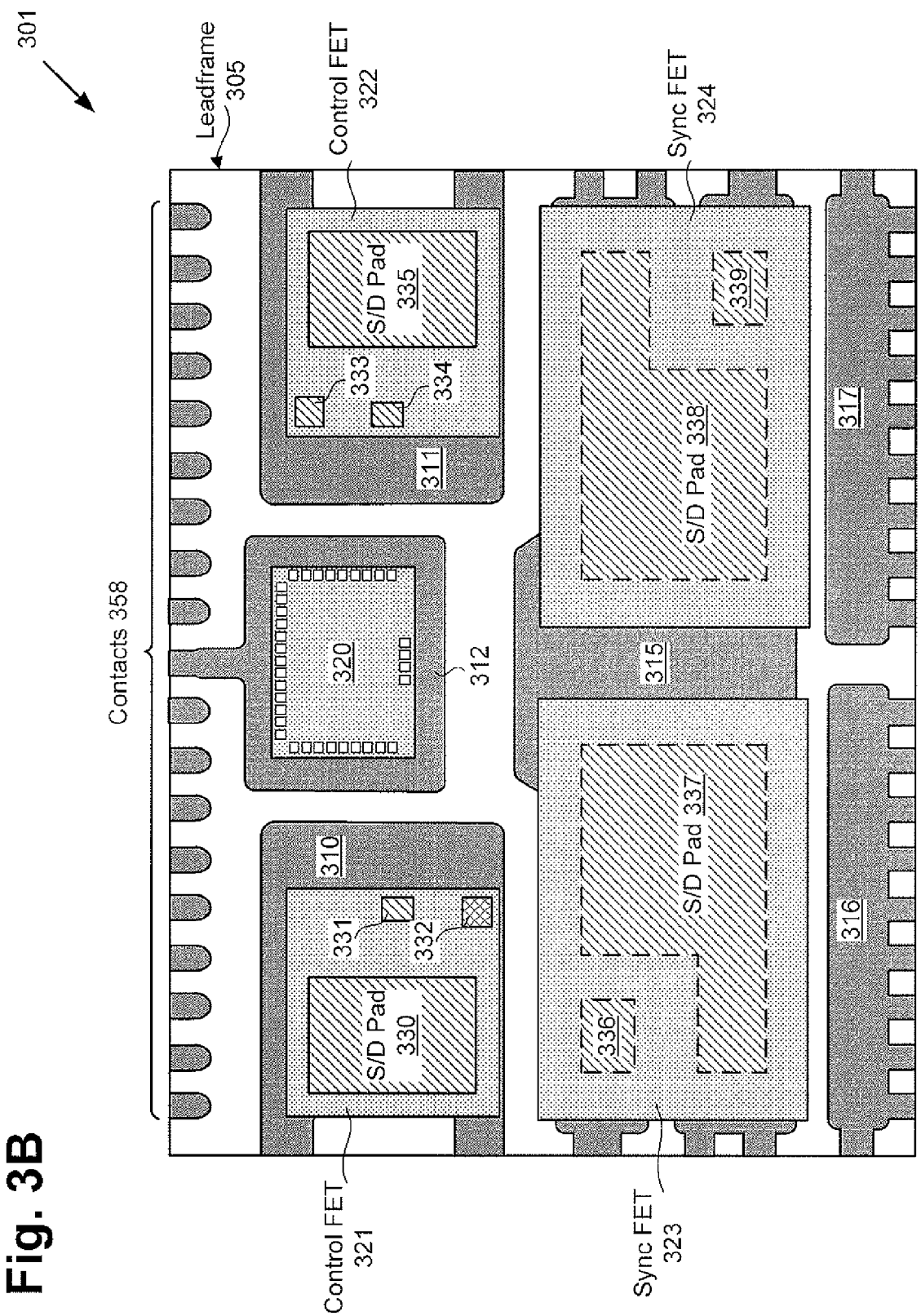
FIG. 3B presents an exemplary top view of a dual power converter package including first and second Control FETs, first and second Sync FETs and a Driver IC, in accordance with one implementation of the present application.
Figure 3C:
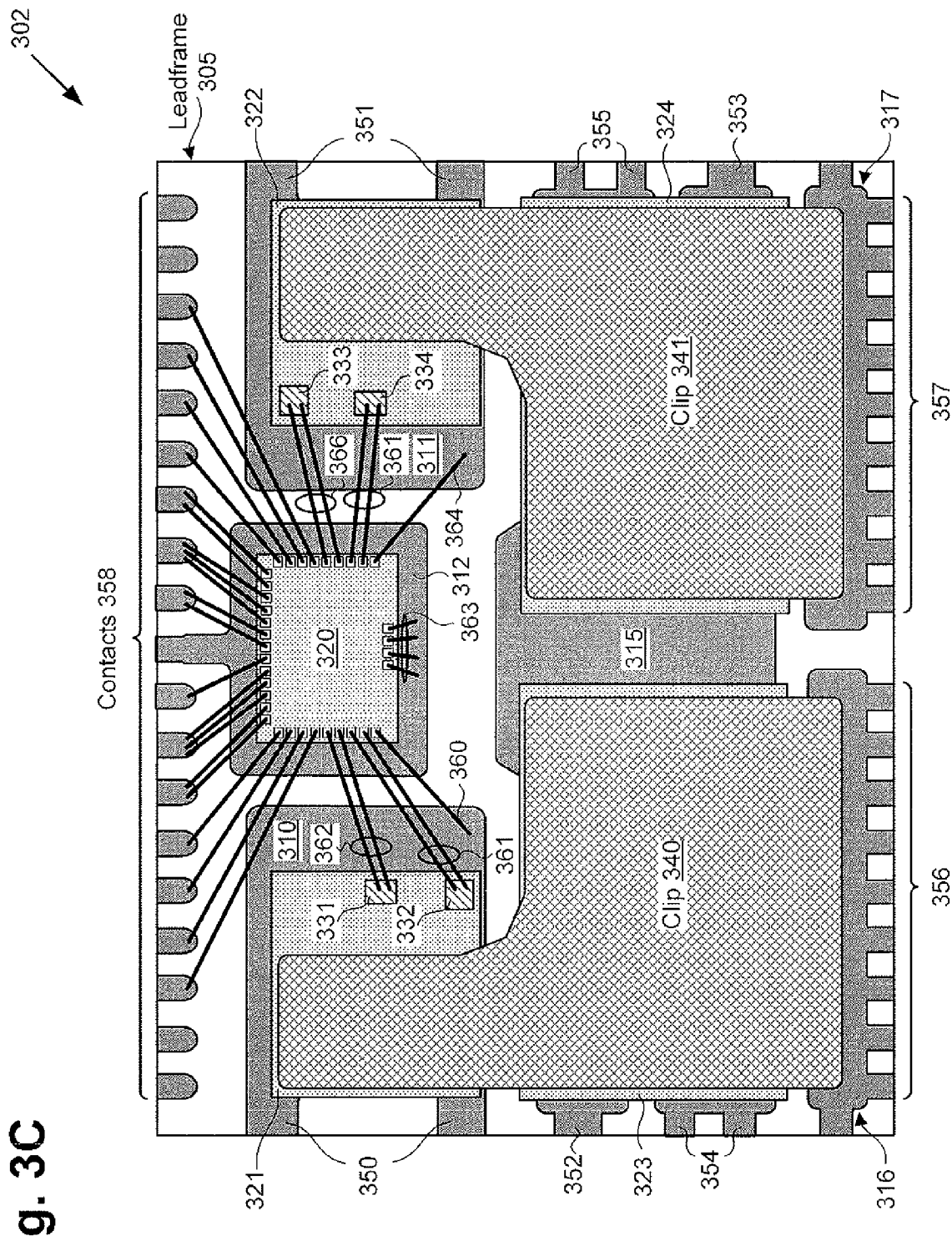
FIG. 3C presents an exemplary top view of a dual power converter package including first and second half-bridge circuits, in accordance with one implementation of the present application.

An exemplary implementation of the present application is further shown in FIGS. 3A, 3B and 3C. FIG. 3A presents an exemplary top view of a dual power converter package, in accordance with one implementation of the present application. Package 300 in FIG. 3A includes leadframe 305 on which is fabricated CNTL PET paddle 310 configured to support a drain of a CNTL FET, such as CNTL FET 121 or 221 for example. CNTL FET paddle 311 is configured to support a drain of another CNTL PET, such as CNTL FET 122 or 222 for example. Leadframe 305 may additionally include a plurality of contacts 358 configured to provide external connection for one or more voltages and/or control signals. SYNC FET paddle 315 is configured to support at least a source of a first SYNC FET and at least a source of a second SYNC FET, such as SYNC PETs 123 and 124 or 223 and 224, respectively. Control IC Paddle 312 may be configured to support a driver IC for controlling each of the CTRL FETs and SYNC FETs. CNTL PET paddles 310 and 311 may be substantially symmetrically fabricated and disposed on leadframe 305 with respect to Control IC Paddle 312. Gate paddles 313 and 314 may be configured to support at least a gate of the first and second SYNC FETs, respectively. Switched node 316 may be configured for electrical connection to the source of a CNTL PET and the drain of a SYNC PET within the first half-bridge circuit via a trace, connector, clip, ribbon or wire. Likewise, switched node 317 may be configured for electrical connection to the source of a CNTL FET and the drain of a SYNC FET of the second half-bridge circuit via a trace, connector, clip, ribbon or wire.

FIG. 3B presents an exemplary top view of a dual power converter package including first and second Control FETs, first and second Sync FETs and a Driver IC, in accordance with one implementation of the present application. FIG. 3B may be substantially the same as FIG. 3A, however, additionally including the following elements. Package 301 may include CNTL FET 321 disposed on CNTL FET paddle 310. Shown in FIG. 3B are source sense pad 331, gate 332, and source/drain 330 on a top side of CNTL FET 321. A drain may be disposed on a bottom side of CNTL FET 321.

Likewise, CNTL FET 322 may be disposed on CNTL FET paddle 311 and may have source sense pad 334, gate 333, and source/drain 335 on its top side and a drain on its bottom side. SYNC FETs 323 and 324 may each be disposed on SYNC FET paddle 315. Gate 336 and a source/drain 337 may be disposed on the bottom side of SYNC FET 323, while gate 336 and source/drain 338 may be disposed on the bottom side of SYNC FET 324 as denoted by the dotted outlines. Additionally a drain may be disposed on a top side of each of SYNC FETs 323 and 324. Each of the gate pads may be configured to rest on a respective one of gate paddles 313 and 314, and each of the source/drain pads may be configured to rest on SYNC FET paddle 315. Finally Driver IC 320 may be disposed on Driver IC Paddle 312 and may be configured to control each of the CNTL FETs and each of the SYNC FETs.

FIG. 3C presents an exemplary top view of a dual power converter package including first and second half-bridge circuits, in accordance with one implementation of the present application. FIG. 3C may be substantially the same as FIG. 3B, however, additionally including the following elements.

Package 302 may include clip 340 disposed on CNTL FET 321 and SYNC FET 323 and configured to electrically connect the source of CNTL PET 321 and the drain of SYNC FET 323 to switched node 316. Likewise, clip 341 may be disposed on CNTL FET 322 and SYNC FET 324 and is configured to electrically connect the source of CNTL FET 322 and the drain of SYNC FET 324 to switched node 317. In this manner, CNTL FET 321 and SYNC FET 323 form a half-bridge suitable for, by way of example, use in a buck converter. Likewise, CNTL FET 322 and SYNC FET 324 form another half-bridge for use in, for example, another buck converter.

Switched node 316 can then be provided to, for example, an inductive/capacitive load (not shown) of a buck converter (not shown) through output voltage contacts 356, which may be formed as portions of switched node 316. Likewise, switched node 317 can then be provided to, for example, an inductive/capacitive load (not shown) of a buck converter (not shown) through output voltage contacts 357, which may be formed as portions of switched node 317.

Driver IC 320 is shared and controls both half-bridges through electrical connection by one or more wires and/or interconnects. More specifically, interconnects 361 may provide control signals from Driver IC 320 to gate 332 of CNTL FET 321, while interconnects 362 are used to sense current at source sense pad 331 of CNTL FET 321. Since CNTL FET paddle 310 is configured to support the drain of CNTL FET 321, Vin$_1$ may be provided to CNTL PET paddle 310 at supply voltage contacts 350, which may be formed as a portion of CNTL FET paddle 310. Thus, interconnect 360 may provide input supply voltage Vin$_1$ to Driver IC 320 through CNTL FET paddle 310.

Likewise, interconnects 366 may provide control signals from Driver IC 320 to gate 333 of CNTL FET 322, while interconnects 365 are used to sense current at source sense pad 334 of CNTL FET 322. Since CNTL FET paddle 311 is configured to support the drain of CNTL PET 322, Vin$_2$ may be provided to CNTL FET paddle 311 at supply voltage contacts 351, which may be formed as a portion of CNTL FET paddle 311. Thus, interconnect 364 may provide input supply voltage Vin$_2$ to Driver IC 320 through CNTL FET paddle 311. Driver IC paddle 312 may be grounded through external connection to one of contacts 358 and a ground connection may be provided to Driver IC 320 through interconnects 363. Because gates 336 and 339 are disposed on the bottom side of SYNC FETs 323 and 324, respectively, control signals from Driver IC 320 may be electrically connected directly to gate contacts 352 and 353, respectively. In one alternative, control signals from the external Driver IC may be electrically connected to one or more of contacts 358, which are in turn electrically connected to gate contacts 352 and 353. In addition, a ground connection may be provided to SYNC FET paddle 315 at ground contacts 354 and ground contacts 355, which may be formed as portions of SYNC FET paddle 315.

The above-described exemplary implementations of the present application result in a smaller form factor and packaging integration by housing two half-bridge circuits, each containing a CNTL FET and SYNC FET in the same package, such that each switched node output can be provided to an inductive/capacitive load to operate two separate buck converters. Moreover, the above-described implementation results in higher current density and current handling capability.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. An integrated dual power converter package comprising:
    a leadframe comprising:
        a first control FET paddle supporting a drain of a first control FET;
        a second control FET paddle supporting a drain of a second control FET;
        a sync FET paddle supporting a source of a first sync FET and a source of a second sync FET;
        a source of said first control FET and a drain of said first sync FET having disposed thereon a first trace, connector, clip, ribbon, or wire;
        a first switched node electrically connected to said source of said first control FET and said drain of said first sync FET;
        a driver integrated circuit (IC) paddle supporting a driver IC for controlling each of said first and second control FETs and each of said first and second sync FETs.

2. The package of claim 1, further comprising a second switched node electrically connected to a source of said second control FET and a drain of said second sync FET via a second trace, connector, clip, ribbon, or wire.

3. The package of claim 1, wherein said first control FET paddle and said second control FET paddle are disposed substantially symmetrically on said leadframe with respect to said driver IC paddle.

4. The package of claim 1, wherein said leadframe further comprises a first supply voltage contact configured for externally receiving a first supply voltage.

5. The package of claim 4, wherein said leadframe further comprises a second supply voltage contact configured for externally receiving a second supply voltage.

6. The package of claim 1, wherein said leadframe further comprises a ground contact for externally receiving a ground connection.

7. The package of claim 2, wherein said leadframe further comprises a first output voltage contact configured to provide a first output voltage from said first switched node.

8. The package of claim 7, wherein said leadframe further comprises a second output voltage contact configured to provide a second output voltage from said second switched node.

9. An integrated dual power converter package comprising:
    a leadframe comprising:
        a first control FET disposed on a first control FET paddle;
        a second control FET disposed on a second control FET paddle;
        a first sync FET and a second sync FET, each disposed on a sync FET paddle;
        a source of said first control FET and a drain of said first sync FET having disposed thereon a first trace, connector, clip, ribbon, or wire;
        a first switched node electrically connected to said source of said first control FET and said drain of said first sync FET;
        a driver integrated circuit (IC) disposed on a driver IC paddle and configured to control said first and second control FETs and said first and second sync FETs.

10. The package of claim 9, wherein said leadframe further comprises a second switched node electrically connected to a source of said second control FET and a drain of said second sync FET via a second trace, connector, clip, ribbon, or wire.

11. The package of claim 9, wherein:
    said first control FET is connected to a first supply voltage through said first control FET paddle;
    said second control FET is connected to a second supply voltage through said second control FET paddle.

12. The package of claim 9, wherein said first sync FET and said second sync FET are connected to ground through said sync FET paddle.

13. The package of claim 9, wherein said first control FET and said first sync FET form a first half-bridge circuit and said second control FET and said second sync FET form a second half-bridge circuit.

14. The package of claim 9, wherein said driver IC is configured to sense a current through said first control FET and/or a current through said second control FET.

15. The package of claim 10, wherein said leadframe further comprises:
    a first output voltage contact configured to provide a first output voltage from said first-switched node;
    a second output voltage contact configured to provide a second output voltage from said second switched node.

* * * * *